United States Patent
Herr

(12) 
(10) Patent No.: US 6,580,310 B2
(45) Date of Patent: Jun. 17, 2003

(54) DOUBLE FLUX QUANTUM SUPERCONDUCTOR DRIVER

(75) Inventor: Quentin P. Herr, Torrance, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 09/934,493

(22) Filed: Aug. 22, 2001

(65) Prior Publication Data

US 2003/0039138 A1 Feb. 27, 2003

(51) Int. Cl.[7] .................................................. H03K 3/38
(52) U.S. Cl. ........................ 327/528; 505/202; 505/210; 333/995
(58) Field of Search .................... 333/99 S; 331/107 S; 327/528; 505/202, 210

(56) References Cited

U.S. PATENT DOCUMENTS 5,963,351 A * 10/1999 Kaplounenko et al. ..... 359/158
6,331,805 B1 * 12/2001 Gupta et al. ............. 331/107 S

OTHER PUBLICATIONS

Geppert et al., "Soliton Amplifiers and Picosecond Pulsers," IBM Technical Disclosure Bulletin, vol. 24, No. 4, Sep. 1981, pp. 2010–2012.*

* cited by examiner

Primary Examiner—Richard Elms
Assistant Examiner—Jung H. Hur
(74) Attorney, Agent, or Firm—Ronald M. Goldman

(57) ABSTRACT

A rapid SFQ one-way buffer (13, 1, 4, 5, 15, 2 & 9), is combined with a Josephson transmission line (17,3, 19, 16, 21 & 4) that is lightly loaded ($R_L$) to provide a superconductor driver capable of producing double flux quantum output pulses. Each SFQ pulse applied to the input of the one-way buffer propagates through the Josephson transmission line to generate a double flux quantum pulse at the transmission line output.

15 Claims, 2 Drawing Sheets

DOUBLE FLUX QUANTUM SUPERCONDUCTOR DRIVER

STATEMENT OF GOVERNMENT RIGHTS

This invention was made with Government support under Contract No. DMEA 90-99-D-0003 awarded by the Defense Microelectronics Activity. The government has certain rights in this invention.

FIELD OF THE INVENTION

This invention relates to lowering bit error rates in superconductor integrated circuit devices, and, more particularly, to a superconductor means for producing useful double flux quantum pulses in response to received single flux quantum pulses.

BACKGROUND OF THE INVENTION

Metals, metal alloys and ceramics found to exhibit zero electrical resistance are commonly referred to as superconductors. Typically, those superconductors don't attain the superconductive state unless cooled to extremely low temperatures, referred to as cryogenic temperatures. Each such superconductor material possesses a unique cryogenic temperature, referred to as the transition temperature ("Tc"), at which the respective metal, metal alloy, or ceramic becomes superconducting, changing in electrical resistance from a measurable or relatively high value of resistance to zero. One known superconductor is niobium, a refractory metal, which transitions to a superconducting state at a temperature of 9.2 Kelvin.

Superconductor digital electronic devices have previously been constructed of superconductors and the functionality of such devices demonstrated. As example, with a zero-resistance characteristic during superconductivity, electrical current induced into a loop formed of the superconductor metal persists indefinitely. With appropriate drivers and sensors, the foregoing loop may serve as a digital memory. When the direction of the current induced in the loop is in a clockwise direction the memory state may represent a "1" digital bit; when the direction of induced current is counterclockwise, the memory state may represent the bit "0".

Superconductor digital electronics devices have been fabricated as integrated circuits on a silicon wafer using the photo-lithographic mask and etch techniques or other known techniques most familiar to those in the semiconductor industry. Such superconductor integrated circuit devices provide the desired functionality in a very small package or chip. Superconductor devices operate at very high speeds, as example, 100 GHz to 770 GHz, and very low power, which is unattainable with present semiconductor devices. Because of the high speeds of operation and low power requirement, superconductor electronic devices remain attractive for many applications.

A principal element to the construction of a superconductor digital electronic device is the Josephson junction. The Josephson junction is formed, as example, of two layers of superconductors, such as niobium, separated by a very thin layer of electrical insulation, such as aluminum oxide. When cooled to the transition temperature and biased with DC current below a certain critical current, ("IC") the Josephson junction is superconducting and the junction conducts current without developing a voltage drop there across and without dissipation of energy, exhibiting no electrical resistance. Consequently, the junction does not produce heat, which is a significant advantage for integrated circuits. If biased above the critical current, the Josephson junction produces an RF signal, consisting of a series of pulses at RF frequencies. Thus, the critical current is a boundary at which the electrical properties of the junction changes as described.

Superconductor circuits utilize the foregoing property of the junction to regenerate single flux quantum ("SFQ") pulses. The time integral of the voltage of a single flux quantum pulse is physical constant approximately equal to 2.07 millivolt picoseconds or, in alternate terms, 2.07 milliamp picohenrys (e.g., h/2e, where h is Plank's constant and e is an electron charge). When a SFQ pulse is applied to a Josephson junction that is properly DC biased below the respective critical current, the current produced by the SFQ pulse when added to the DC bias current may cause the Josephson junction to brief exceed the critical current. The Josephson junction then undergoes a 360 degree shift in quantum phase or, as otherwise termed, electronically "flips-over." In undergoing that shift the Josephson junction reproduces the single flux quantum pulse in response a the applied SFQ pulse.

In superconducting integrated circuit ("IC") devices containing multiple Josephson junctions, the junctions are formed on a common superconductor metal layer, referred to as a ground plane, deposited over an insulator substrate, such as silicon. The multiple Josephson junction devices may be logically divided into groups of two or more junctions, the groups, sometimes referred to as "SQUIDs" (an acronym for superconducting quantum interference device). For example, a single flux quantum pulse transmission line, referred to as a Josephson transmission line, may be formed of a number of SQUIDs arranged in serial order, each SQUID containing two Josephson junctions connected electrically in parallel in a superconducting loop, the latter also sometimes referred to as a Josephson loop.

A single flux quantum pulse applied to the input of the Josephson transmission line ("JTL"), may be said to propagate along the transmission line to the output, moving from SQUID to SQUID in that line, and thence to the electrical load connected to the output of the transmission line. In fact, the SFQ pulse is regenerated at each Josephson junction (stage), which can produce current and power gain. The transmission line may in total contain two or more Josephson junctions, the number of Josephson junctions (and SQUIDs) that form the transmission line can be increased to traverse the desired distance.

Digital integrated circuits require superconductor chip-to-chip communication to convey Single Flux Quanta. The assignee of the present invention has internally demonstrated chip-to-chip communication of SFQ pulses at rates of up to 20 Gbps on a superconductor chip mounted on a passive superconductor carrier. However, the bit error rate ("BER") was found to increase with frequency and exceeded a self-imposed limit of $10e^{-16}$ at frequencies over five Gbps. The presence of attenuation and reflections (e.g. transients) on the chip-to-chip transmission line and other electronic noise which mask or obscure the digital bits at random is a principal factor causing bit errors. Those influences increase in adverse effect as the frequencies increase to 20 Gpbs, to 40 Gpbs, and more so at 100 Gpbs, the more desirable frequency regions for communication, and produce unacceptable bit error rates. The need to remove those influences, or to minimize the adverse affect of those influences or to otherwise lower the BER is apparent if superconductor chip-to-chip communication at those frequencies is ever to succeed.

When the foregoing kind of problem occurs in non-superconductor electronic devices commonly used at lower frequencies, such as semiconductor circuits, a known solution is to amplify the desired signal, that is, employ a driver to amplify and apply the amplified signal to the succeeding "noisy" stages of the communications equipment, thereby raising the level of signal relative to the electronic noise, the signal-to-noise ratio. By definition, a driver is a device that supplies a useful amount of signal energy to another device to insure the proper operation of the latter device. By upgrading the signal relative to the noise, the succeeding stages in the electronic apparatus more readily recognizes the signal, and, hence, the error rate is minimized or eliminated.

Although a Josephson junction is an active device, the junction cannot function as a signal amplifier in the customary sense. The only superconductor devices heretofore known in the superconductor art that are capable of obtaining operational speeds of twenty to one hundred Gbps with a negligible BER generate single flux quantum pulses. Otherwise, no superconductor drivers have been known previously. The unavailability of a useful superconductor driver would be expected to lead one to explore other alternatives for lowering the bit error rate. However, as an advantage, the present invention provides a new and useful superconductor driver.

An object of the present invention is to reduce the bit error rate in operation of superconductor digital communications circuits, and, in particular, in superconductor chip-to-chip communication.

Another object of the invention is to provide a driver for superconductor circuits.

Still another object of the invention is to enable effective superconductor chip-to-chip communications at frequencies of 20, 40 and 100 Gpbs.

A further object of the invention is to increase the strength of the data pulses in a superconductor device; to effectively multiply a single flux quantum pulse in size.

And a still further object of the invention is to provide a superconductor driver capable of providing a flux quantum pulse greater in size than a single flux quantum pulse and use that larger pulse to drive subsequent superconductor circuits.

SUMMARY

In accordance with the foregoing objects and advantages, a superconductor driver is formed by combining a rapid SFQ one-way buffer together in series with a Josephson transmission line that is lightly loaded. It is found that in response to each SFQ pulse applied to the input of the one-way buffer, a double flux quantum pulse is generated at the transmission line output. Preferably, to ensure light loading the load on the transmission line is at least three to eight times greater in resistance than the shunt resistance necessary to critically damp the Josephson Junction.

SFQ pulses applied to the input of the driver propagate through the one-way buffer and along the Josephson transmission line. Because the Josephson transmission line emulates an open-circuit line, the SFQ pulse triggers the final Josephson junction in the transmission line to generate a flux quantum pulse voltage that is twice as great as that of the incident SFQ pulse. That double flux quantum pulse may be usefully applied to light loads. The one-way buffer blocks SFQ pulses reflected from the output end of the transmission line from reaching the input, thereby protecting the input.

In accordance with an additional aspect to the invention, the JTL is under-damped. A more specific aspect to the invention is that a Josephson junction serves as the one-way gate to the buffer. Joining two known superconductor devices, the Josephson one-way buffer and the lightly loaded Josephson transmission line, together into a combination, new, unanticipated and useful results are achieved.

The foregoing and additional objects and advantages of the invention, together with the structure characteristic thereof, that were only briefly summarized in the foregoing passages, will become more apparent to those skilled in the art upon reading the detailed description of a preferred embodiment of the invention, which follows in this specification, taken together with the illustrations thereof presented in the accompanying drawings.

DESCRIPTION OF THE PREFERRED EMBODIMENTS

Figure 1:
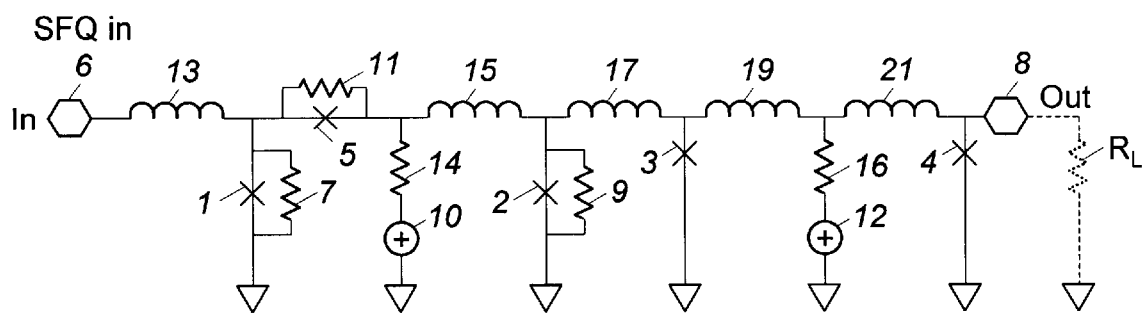
FIG. 1 is a schematic of an embodiment of the invention.

An embodiment of a superconductor driver circuit constructed in accordance with the invention is illustrated schematically in FIG. 1 to which reference is made. The driver contains five Josephson Junctions 1, 2, 3, 4 and 5, illustrated by the symbol "X", five inductors 13, 15, 17, 19 and 21; and resistances 7, 11, 9, 14 and 16. As those skilled in the art recognize, Josephson Junctions 3 and 4 and inductance's 17, 19 and 21 form a Josephson transmission line; and Junctions 1 and 2 together with inductance's 13 and 15 in a sense form another Josephson transmission line; and that the two transmission lines are series connected to form a longer transmission line connected between and input 6 and an output 8. However, Josephson junction 5 is located in one of the foregoing transmission lines proximate input 6 and following junction 1 and functions as a one-way bypass for SFQ pulses, later herein more fully described. Accordingly, one may characterize or refer to the one of the foregoing Josephson transmission lines containing junction 5 to be a transmission line containing a one-way bypass or simply as a "one-way buffer". Although both characterizations are technically correct, the latter terminology is believed to be more in keeping with industry practice and is used herein.

The voltage source 10 for the left portion of the driver is a voltage bus that supplies DC current. The voltage source 12 for the junctions in the right portion of the driver is also a voltage bus that supplies DC current. The foregoing buses may be combined, since only a single voltage bus is required. Resistor 14 is in series with the bias supply at 10 and determines the DC bias current level to Josephson junctions 1 and 2. Resistor 16 is connected in series with the bias supply at 12 for Josephson junctions 3 and 4 and determines the DC bias current to those junctions.

Inductors 13, 15, 17, 19 and 21 symbolize the self-inductance of the interconnecting electrical leads in the circuit, which, physically, appear as relatively straight leads, later herein illustrated in the layout of FIG. 3, later herein described. Inductor 13 represents the self-inductance of the lead from input 6 to one side of junction 1 (e.g. the input to the one-way gate), and the other end of the latter junction is connected to circuit ground. Junction 5 connects between the one side of junction 1 and an end of inductor 15, representing the self-inductance of the electrical lead to a first end of junction 2. The remaining end of junction 2 is connected to circuit ground. Junction 5 serves as the one-way gate, later herein described in greater detail.

It may be noted that the distributed capacitance inherent in the leads forming the Josephson transmission line are not represented since, unlike the self inductance, the capacitance is too small to have noticeable effect even at the very high speeds being contemplated for operation. By known design technique, the physical distance between each Josephson junction in the transmission line is maintained short enough so that the distributed capacitance of any leads is not large enough so as to require consideration. On the other hand, if the capacitance internal to the junctions were small enough relative to the distributed capacitance of the wiring, the inductors would be better modeled as transmission line. Operating principles of the circuit, notwithstanding, would remain unchanged.

The first end of junction 2 is also connected via inductor 17 (e.g. the input to the Josephson transmission line or second SQUID), also representing the self-inductance of the wiring, to a first terminal of junction 3 and one end of inductor 19. The remaining terminal of junction 3 is connected to circuit ground. Inductors 19 and 21, each representing the self-inductance of separate portions of the metal wiring, are serially connected to one end of junction 4 and output terminal 8. The remaining terminal of Junction 4 is connected to circuit ground.

Voltage source 10 connects through series resistance 14 to a location in the circuit to one side of inductor 15 and junction 5. Voltage source 12 connects through resistor 16 to the juncture in the circuit between inductors 19 and 21. Resistor 7 is electrically connected in shunt circuit of junction 1, resistor 9 is in shunt of junction 2 and resistor 11 is in shunt of junction 5.

All parameter values for the one-way buffer portion of the circuit of FIG. 1, comprising elements 1, 2, 4, 5, 7, 9, 11 and 13, are chosen according to standard design values existing in the prior art. The shunt resistors 7, 9 and 11 are included to critically damp the associated Josephson Junctions. As is known those shunt resistors are used to produce an effective junction with the correct the "I-V" characteristic, which indicates the dynamic behavior of the shunted junction. However, for certain design approaches and for certain junction types, those resistors, are not necessary to the operation of the invention, and, may be omitted.

SFQ circuits generally use critically damped Josephson junctions. That means the value of the resistor placed in shunt of the junction is chosen such that the Stewart-McCumber parameter, known in the art, is near unity. That condition corresponds to relaxation of voltage "ringing", internal to the junction, in a minimum amount of time. For example, a junction having a critical current of 0.5 mA and internal capacitance of 0.7 pF, typical values for a junction, is critically damped by a shunt resistor of one ohm resistance. By thereby adjusting the I-V characteristic of the particular Josephson Junction selected for use in the circuit with the shunt resistor, multiple flux quantum switching in the junction within a single cycle is prevented. The shunt resistor value that produces critically damped junctions may sometimes be referred to herein as the characteristic Josephson transmission line impedance.

As those skilled in the art recognize, the shunt resistors to the Josephson junctions are not required for operation of the embodiment. They are included to note a practical design consideration for obtaining better performance, as they are incorporated in a practical embodiment of the applicant's invention. One may decide to forego use of such resistors, and operate at less than optimal conditions; and the invention will still perform as described, just not as well. Moreover, different makes of practical Josephson junctions may possess the desired I-V characteristic in the first instance and no adjustment is necessary. Hence, other practical embodiments of the foregoing invention might not require any tailoring of the Josephson Junctions with shunt resistors.

Parameter values for the Josephson transmission line portion of the circuit of FIG. 1, comprising elements 3, 4, 16, 17, 19 and 21 are generally different than the standard values used in the prior art. In particular, junctions 3 and 4 are not explicitly damped (i.e. shunt resistors are not included) in order to produce a light damping condition at the output of the transmission line. Even so, it may be noted that the characteristic impedance of a Josephson transmission line, such as the foregoing transmission line containing junctions 3 and 4 remains (as earlier defined) as the resistance value of the shunt resistance that is necessary to critically damp junction 3 or junction 4, even though those junctions are not shunted by a resistance.

For operation, the driver is connected to a light electrical load $R_L$, represented in phantom lines in the figure. In accordance with the invention the load is light, that is relatively high in resistance, suitably at least three times as great as the value of shunt resistance required to produce a critically damped junction so that the transmission line output should emulate an open-circuit as "seen" from the Josephson transmission line. DC bias current flows through resistor 14 and around to the left through junction 5 (and shunt resistor 11) and through junction 1 (and shunt resistor 7) to ground through which the current returns to the power supply. Current also flows through inductor 15 and junction 2 (and shunt resistor 9) to ground. Resistor 14 sets the bias current level. Preferably the bias is set so that the current equals about 70% of the critical current, $I_c$, for junctions 1 and 5 and for junction 2. All three of the foregoing junctions have approximately the same specified critical current.

On the right side of the figure, DC bias current is supplied through terminal 12 and flows through resistor 16 inductor 19, junction 3 and inductor 23 to ground; and flows through the foregoing resistor, junction 4, and inductor 25 to ground. Preferably the bias is set so that the current equals about 35% of the critical current, $I_c$, for each of junctions 3 and 4. The latter junctions have the same specified critical current. The foregoing driver circuit is cooled to the appropriate low temperature at which the junctions and the metal wiring are superconducting, and, hence, loss-less.

Because the driver output is not resistively damped, if a typical bias were to be used, the Josephson Junctions 3 and 4 could tend to effectively "run away" and produce multiple pulses when triggered. By requiring a larger current to be applied (to add to the bias current) before the current through the junction exceeds the critical current, proper triggering of the junction "flip-over" is assured. The smaller variations in bias current produced by transients internally within the driver are not sufficient alone to drive the Josephson Junction beyond the critical current.

As thus prepared for operation, single flux quantum pulses, derived indirectly from pulses produced by an external digital electronic circuit, not illustrated, are applied at input 6 of the driver circuit. Those digital electronic pulses are very short in duration, are presented at high speed, in accordance with a particular modulation protocol, and represent digital data, the details of which are not material to the present invention. For the discussion of the operation of the driver, only a couple of those pulses are considered in detail.

The pulse inputted propagates through inductor 13 and takes the path of least impedance through Josephson junction 1, raising the current through the junction above the critical current of that junction. Junction 1 thereby generates an SFQ pulse, and that SFQ pulse passes to the left and to the right along the metal wiring. That propagating to the left cancels out the input pulse; that to the right propagates through junction 5, which is in the superconducting state, and through inductor 15 and is applied to junction 2. The SFQ pulse causes the current through junction 2 to exceed the critical current of the junction, and, in-turn, the latter junction generates an SFQ pulse. The foregoing pulse SFQ pulse moves though inductance 17 and is applied to Josephson junction 3. The latter junction regenerates the SFQ pulse, which moves through inductance's 19 and 21 and is applied to Josephson junction 4, located at the output 8 of the Josephson transmission line.

As earlier described, the driver circuit is resistively loaded by a relatively high resistive load, $R_L$, high relative to the condition for critical damping, the latter of which, typically, is about one ohm, whereby the transmission line effectively emulates an open-circuit transmission line. That is, the discontinuity of the end of the line creates a reflection of the incident pulse. Thus, suitably, the load for the driver should be one that ranges from about three to eight times the critical damping of a single junction up to an infinitely large value (e.g. an open circuit).

According to conventional Josephson transmission line dynamics, an SFQ pulse at input 6 effectively moves through junctions 1, 2 and 3 (left to right in the figure), triggering a $2\pi$ phase advance in each junction In turn. The SFQ pulse then moves to junction 4. When junction 4 triggered, the SFQ pulse undergoes a $4\pi$ phase advance, thus producing a double flux quantum pulse (e.g., a pulse having a time integral of twice that of the single flux quantum pulse) with an output voltage that has twice the amplitude of the SFQ pulse, which is referred to as a high energy double flux quantum ("DFQ") pulse. It is noted that the propagating pulse does not affect junction 5 as the pulse moves to the right toward the output and that the junction remains fully conductive, with no electrical resistance. The current produced by the pulse propagating to the right is subtractive to the bias current applied to junction 5, inputted through bias input 10, so junction 5 does not attain the critical current.

The triggering of Josephson junction 4 also produces a back traveling SFQ pulse (e.g. the reflected pulse). The back traveling pulse undergoes additional $2\pi$ phase advances in both junctions 3 and 2 as the pulse effectively propagates in the reverse direction (e.g. right to left in the figure) toward input 6; and then undergoes another $2\pi$ advance in junction 5.

Figure 2:
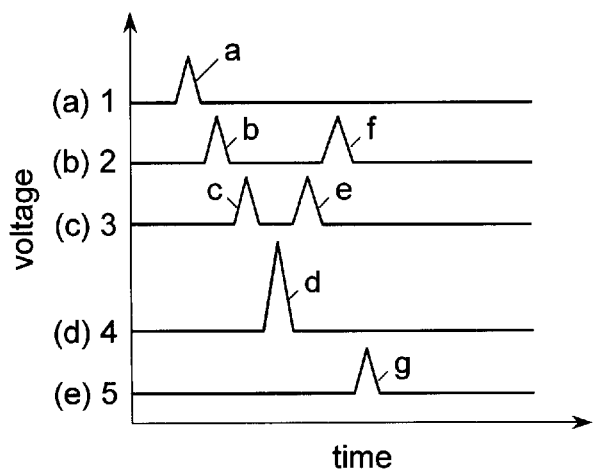
FIGS. 2(a)–2(e) illustrate the voltages produced at the various Josephson junctions during operation of the embodiment of FIG. 1.

The foregoing pulses are graphically illustrated in FIG. 2, which shows the pulse triggered in each of the Josephson Junctions as a function of time of application of the SFQ pulse to input 6. The ordinate is the denomination of the particular Josephson Junction. FIG. 2(a) shows the SFQ pulse "a" generated by junction 1. FIG. 2(b) shows the pulse "b" subsequently generated at junction 2. FIG. 2(c) shows the pulse "c" generated subsequently at junction 3. FIG. 2(d) illustrates the pulse "d" generated subsequently at junction 4. As shown, the latter pulse is double the amplitude of the SFQ pulse. The reflected SFQ pulse travels from the output back to junction 3, which triggers the junction to regenerate the pulse "e". That pulse is represented as the second pulse in FIG. 2(d). That SFQ pulse moves further to the left and triggers junction 2, and the voltage of that regenerated pulse "f", is represented as the second pulse in FIG. 2(b).

The SFQ pulse then moves further to the left and triggers junction 5. Since the DC bias current through Josephson junction 5 is from input 10 to the left, through junction 1, which is fully conducting, to ground, the current produced by the reflected pulse is in the same direction as the bias current. Being thus additive, the current through the junction exceeds the critical current and the junction triggers. The SFQ pulse thus "escapes" from the circuit, any energy associated therewith being dissipated in shunt resistance 11. Josephson Junction 1, which cannot be triggered simultaneously with junction 5, although conducting, is inhibited and cannot generate an SFQ pulse. FIG. 2(e) shows the pulse "g" generated at junction 5. This pulse is generated only when the reflected pulse travels from the output of the transmission line to the junction. Thus junction 5 acts as a one-way gate or bypass device within the Josephson transmission line that blocks the reflected pulse from reaching input 6, protecting the input. The use of a Josephson junction to protect an input from back traveling pulse as with junction 5 is known to those skilled in the art.

Because the physical quantities in the circuit are of the order of millivolts, milliamps, and picohenrys, the self-inductance is visible physically only as lengths of metal wiring. That physical aspect is evident from the integrated circuit ("IC") layout of FIG. 2 to which reference is made. The layout is presented in a CAD-CAM top view, and does not illustrate the vertical levels of the elements in the chip, all of which are known to those skilled in the superconductor art.

Figure 3:
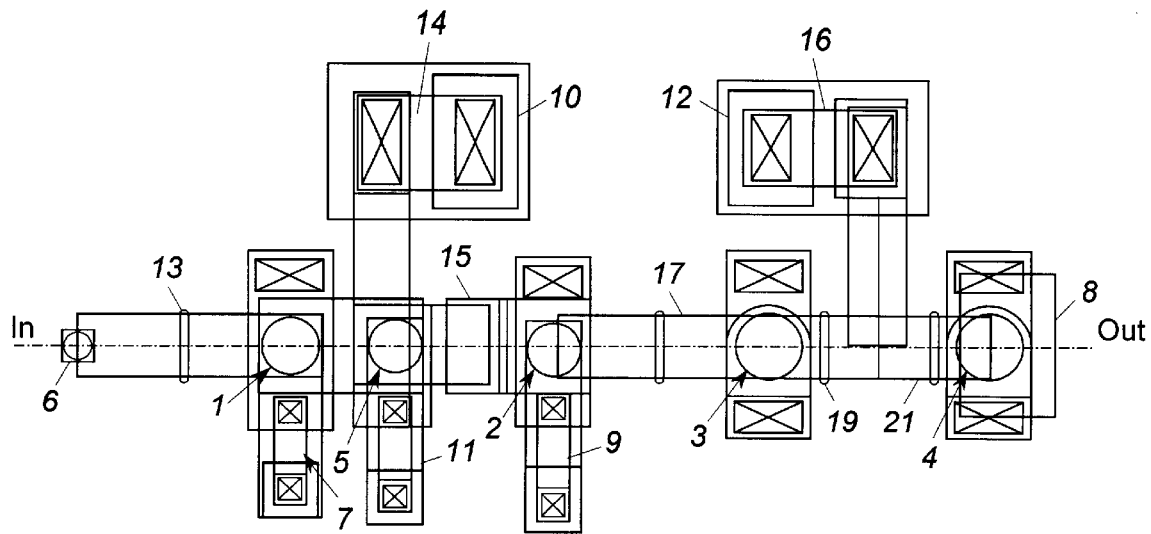
FIG. 3 is a layout the embodiment of FIG. 1.

Those elements identified by number in the schematic of FIG. 1 are also identified by the same number in the integrated circuit layout of FIG. 3. Josephson junctions 1, 5, 2, 3 and 4 are arranged in a row, extending from left to right. The wiring strips 13, 15, 17, 19 and 21, which were symbolically indicated by the conventional inductor symbol in FIG. 1 are seen as relatively straight flat lines. Since the foregoing is a practical form of the same circuit earlier illustrated in schematic form and described, no additional description is necessary.

The foregoing driver circuit of FIG. 1 has a close analogy with a conventional passive open circuit transmission line that is formed of strictly passive components, such as a two-wire or coaxial line. A voltage transient launched on such an open-circuit transmission line, as is known, is reflected from the open end of the line and produces twice the voltage at the open end. However, unlike the present circuit, an electrical load cannot be applied to the open end of a passive open-circuit transmission line, since the voltage at the end would reduce dramatically. Hence, that end must remain open on the passive transmission line. Further, the back traveling (e.g. reflected) pulse cannot be "killed", as with the present invention. And the conventional passive transmission line contains bandwidth limitations; the present driver none.

The new driver provides significant benefits. Proper resistive damping may be applied to the superconductor receiver or superconductor driver without adversely affecting superconductor chip-to-chip communication. Even though a portion of the energy produced by the driver is dissipated in the resistance, the double-size pulse produced contains enough energy to spare, sufficient to properly pulse the superconductor receiver. Preferably the damping resistance is placed in series circuit with the transmission line and will have a resistance value (e.g. the number of ohms of resistance) that is the same as the characteristic impedance, $Z_O$, of the transmission line. Instead of the driver (or receiver as the case may be) appearing as a short-circuit to ground (to the other part of the circuit), the driver (or, respectively, receiver) appears as a resistance to ground.

A damping resistor is used to absorb transients as might propagate on the transmission line. Transients may be generated by reflection from discontinuities in the transmission circuit, such as the presence of bonding pads. Transients may also be generated in the Josephson Junction of the receiver if the pulse input to the superconducting receiver is either smaller or larger than a single flux quantum pulse, which the Josephson Junction of the receiver, by design, absorbs. When the received pulse is larger than a SFQ pulse, the unabsorbed portion of the received pulse is reflected back toward the transmitter and constitutes a transient. When the received pulse is smaller than an SFQ pulse, the portion of the SFQ pulse generated by the Josephson Junction of the receiver in excess of the received pulse is reflected back toward the transmitter, and also constitutes a transient. A lossy material, such as a resistor, included in the transmission path, should ideally absorb those transients.

Figure 4A:
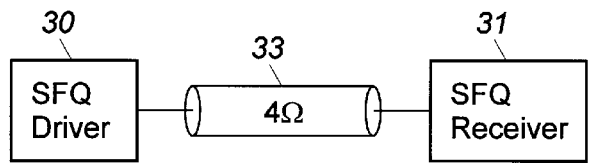
FIGS. 4(a)–4(c) schematically illustrate circuits in which the foregoing embodiment may be applied.
Figure 4B:
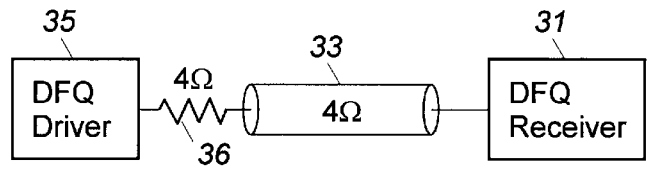

As example, compare FIG. 4A to FIG. 4B. The schematic of FIG. 4A shows the transmission of a single flux quantum pulse from the transmitter, SFQ driver 30 to an SFQ receiver 31 over a superconductor microstrip line 33, which has a characteristic impedance of four ohms. The SFQ pulse is absorbed by the receiver. With the double quantum flux driver 35 in FIG. 4B, and a damping resistor 36 added in series with the superconductor microstrip transmission line, half of the double-size flux is attenuated in the damping resistor, and half in the SFQ receiver. The SFQ on the microstrip has the same energy as before (FIG. 1), but with the damping resistor the transmission circuit is able to terminate transients, thereby reducing electronic noise in the circuit. Note that the total of eight ohms resistive load on the DFQ driver is a light load as specified in the foregoing description of the invention.

Another advantage of the driver is that the driver is able to feed into transmission lines (such as microstrip) that are higher in characteristic impedance than heretofore and yet deliver the same power and obtain the same performance as when a lower impedance transmission line was used. As example, instead of a four-ohm transmission line, a six ohm transmission line may be used with the driver. Although 50% greater in impedance, the driver is able to deliver similar amount of energy to the receiver.

Figure 4C:
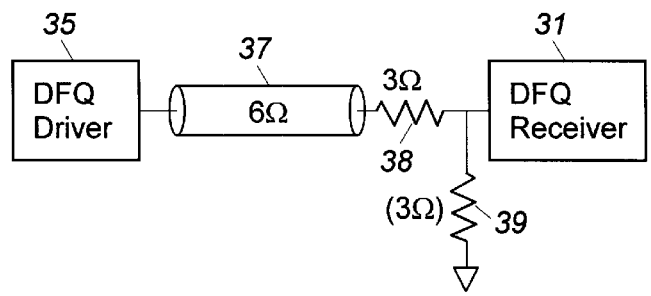

The foregoing is schematically illustrated in FIG. 4C in which the superconductor microstrip line 37 possesses a characteristic impedance of six ohms. The six ohm termination resistor is located on the receiver. That termination resistor is in two parts: A damping resistor 38 of three ohms is in series with the line, and a shunt resistor 39 of equal resistance value to that of the damping resistor is applied between the input of SFQ receiver 31 and circuit ground. In practice, the damping resistor between input and ground may be of a larger value or be eliminated altogether, since the receiver will nonetheless absorb the SFQ pulse, as desired, producing a small or negligible transient.

In FIGS. 4A–4C the microstrip line is superconducting and, hence, loss-less. If, however, the microstrip line is not superconducting, the line will inherently possess resistive losses. Those resistive losses may substitute for the damping resistance that was added in the foregoing superconductor microstrip lines.

The driver is also able to output into a "lossy" microstrip, a microstrip line with attenuation of up to six dB, not possible with a single quantum flux pulse. Although a superconductor microstrip line is not lossy, an ordinary microstrip line may contain a good deal of loss. That resistive loss may be sufficient to avoid any necessity for including a damping resister in series with the transmission line, eliminating a component, its complexity of manufacture and cost. As in the case of the damping resistor, earlier described, the surplus power produced by the driver is sufficient to provide sufficient power to the receiver despite the lossiness of the transmission line.

With the driver, a superconductor receiver may incorporate Josephson Junctions that are larger in size than previously, hence, higher values of $I_c$. The critical current, $I_c$, necessary to "flip" a given Josephson Junction is proportionally related to the area of the insulator in the junction specified by the designer. The larger the area for that region, the larger is the value of $I_c$; the smaller the area, the smaller the value of $I_c$ for the Josephson Junction. However, when the value of the critical current is small, then the Josephson Junction becomes more susceptible to thermal noise, which is undesirable. The noise may cause the junction to flip prematurely, and/or erratically. With a larger critical current value for the junction, that problem is avoided.

The use of the driver results in a lower bit error rate. Since the driver produces ample power digital bits are distinct and unhampered by electronic noise and transients which are significantly lower in level and/or are entirely eliminated for reasons earlier described. Likewise, the elimination of transients permits higher speed operation without the generation of transients.

As earlier defined, to achieve the double size pulse, the load impedance for the driver must be light compared to the value of the shunt resistor that obtains critical damping of the Josephson junction. Although there is no critical line of demarcation between what constitutes a light load versus a heavy one, as a practical measure it is believed that when a value of load impedance is below three times the Josephson transmission line impedance (e.g. the value of the shunt resistor that obtains critical damping of the Josephson junction) the driver will function, but the output pulse will be so reduced as to render the circuit ineffectual as a driver; that with a load of a value about eight times the characteristic impedance of the Josephson transmission line (and greater) one can be confident hat the output pulse will be a double size pulse. In sum, the higher the load impedance one can as a practical measure employ to load the driver, the better.

The foregoing embodiment employs an undamped Josephson transmission line, that is, the line does not incorporate a series resistance. In other embodiments, however, one may include a damping resistance without departing from the scope of the invention.

Although the terminology used in this specification is understood by those skilled in the superconductor field or has been implicitly defined, some additional definitions may be helpful to the less skilled reader. The term "propagation" or "transmission" as used herein in connection with a Josephson transmission line refers to the movement of a flux quantum pulse along a line and/or through an inductance and the function of the Josephson junction in receiving that flux quantum pulse and regenerating flux quantum pulse for further movement in the same direction as before. As used herein "receiver" means a superconductor receiver, an electronically operated receiver that for operation relies upon the phenomenon of superconductivity of metals, and the Josephson Junction. The term "transmitter" means a superconductor transmitter, an electronically operated transmitter that for operation also relies upon the foregoing phenomenon and junction.

Further, unless the context admits otherwise, RF transmission line, as used herein means a transmission line that does not rely upon superconductivity in performing its function and is passive. Hence an ordinary passive electrical transmission line, such a parallel wire line or a microstrip line, as example, is an RF transmission line. A superconductive RF transmission line is one in which the conductors of the line are superconductive. Josephson transmission line ("JTL") means a transmission line that incorporates a SQUID or SQUIDS formed of Josephson Junctions to effectively transfer quantum flux pulses from place to place, in accordance with the physical principles of reception and regeneration of SFQ pulses, and is an active transmission line. A double junction SQUID is a known superconductor circuit containing a pair of Josephson Junctions.

It is believed that the foregoing description of the preferred embodiments of the invention is sufficient in detail to enable one skilled in the art to make and use the invention without undue experimentation. However, it is expressly understood that the detail of the elements comprising the embodiment presented for the foregoing purpose is not intended to limit the scope of the invention in any way, in as much as equivalents to those elements and other modifications thereof, all of which come within the scope of the invention, will become apparent to those skilled in the art upon reading this specification. Thus, the invention is to be broadly construed within the full scope of the appended claims.

What is claimed is:

1. A superconductor driver for producing double flux quantum pulses at an output for application to a load in response to single flux quantum pulses applied to an input, comprising:
    a Josephson transmission line connected between said input and said output, said Josephson transmission line having a characteristic impedance much smaller than the characteristic impedance of said load, wherein said transmission line emulates an open-circuit transmission line to produce a double flux quantum pulse at said output and reflect a single flux quantum pulse toward said input; and
    said transmission line further including superconductor one-way bypass means positioned in said transmission line proximate said input and remote from said output for preventing SFQ pulses reflected from said output from propagating to said input, but permitting SFQ pulses received at said input to propagate to said output of said transmission line.

2. The superconductor driver as defined in claim 1, wherein said one-way bypass means comprises a Josephson junction connected in series in said Josephson transmission line.

3. The superconductor driver as defined in claim 1, wherein said characteristic impedance of said load is no less than three times as large as said characteristic impedance of said Josephson transmission line.

4. The superconductor driver as defined in claim 3, wherein said characteristic impedance of said load is at least eight times as large as said characteristic impedance of said Josephson transmission line.

5. The superconductor as defined in claim 1, wherein said Josephson transmission line comprises:
    a first stage, said first stage having an input connected to said driver input by an inductive line, and including an output;
    said first stage comprising first and second Josephson Junctions arranged in a Josephson loop, said first Josephson Junction including a first end, said first end defining said input of said first stage;
    a second stage;
    said second stage having an input connected to said output of said first stage by an inductive line, and including an output;
    said second stage comprising: third and fourth Josephson Junctions arranged in a Josephson loop, said third Josephson Junction including a first end, said first end defining said input of said second stage, said fourth Josephson Junction including a first end, said first end defining said output of said second stage;
    a first bias current input for said first stage;
    a second bias current input for said second stage; and
    wherein said one-way bypass means comprises a fifth Josephson junction;
    said fifth Josephson Junction having a first end and a second end, said first end of said fifth Josephson Junction being connected in series with said bias current input, and said second end of said fifth Josephson Junction being connected to said first end of said first Josephson Junction to place said fifth Josephson Junction in DC series circuit with said first bias input and said first Josephson Junction and in series circuit with said input and output of said first stage for passing of SFQ pulses applied to said input of said first stage to said output and for preventing SFQ pulses from said output of said first stage from passing to said input of said first stage.

6. The superconductor driver as defined in claim 5, wherein said first bias input supplies a bias current to said first and second Josephson Junctions of about 70% of the critical current of said junctions, and wherein said second bias input supplies a bias current to said third and fourth Josephson Junctions of about 35% of the critical current of said junctions.

7. A superconductor driver for producing flux quantum pulses at an output for application to a load in response to single flux quantum pulses applied to an input, comprising:
    a Josephson transmission line connected between said input and said output, said Josephson transmission line having a characteristic impedance much smaller than the characteristic impedance of said load, wherein said transmission line emulates an open-circuit transmission line to produce a double flux quantum pulse at said output and reflect a single flux quantum pulse toward said input; and
    said transmission line further including superconductor one-way bypass means positioned in said transmission line proximate said input and remote from said output for preventing SFQ pulses reflected from said output from propagating to said input, but permitting SFQ pulses received at said input to propagate to said output of said transmission line, said one-way bypass means comprising a Josephson junction connected in series in said Josephson transmission line;
    said characteristic impedance of said load being no less than four times as large as said characteristic impedance of said Josephson transmission line;

said Josephson transmission line further comprising:
a first stage, said first stage having an input connected to said driver input by an inductive line, and including an output;
said first stage comprising first and second Josephson Junctions arranged in a Josephson loop, said first Josephson Junction including a first end, said first end defining said input of said first stage;
a second stage;
said second stage having an input connected to said output of said first stage by an inductive line, and including an output;
said second stage comprising: third and fourth Josephson Junctions arranged in a Josephson loop, said third Josephson Junction including a first end, said first end defining said input of said second stage, said fourth Josephson Junction including a first end, said first end defining said output of said second stage;
a first bias current input for said first stage;
a second bias current input for said second stage; and
wherein said one-way bypass means comprises a fifth Josephson junction;
said fifth Josephson Junction having a first end and a second end, said first end of said fifth Josephson Junction being connected in series with said bias current input, and said second end of said fifth Josephson Junction being connected to said first end of said first Josephson Junction to place said fifth Josephson Junction in DC series circuit with said first bias input and said first Josephson Junction and in series circuit with said input and output of said first stage for passing of SFQ pulses applied to said input of said first stage to said output and for preventing SFQ pulses from said output of said first stage from passing to said input of said first stage;
said first bias input for supplying a bias current to said first and second Josephson Junctions of about 70% of the critical current of said junctions, and wherein said second bias input for supplying a bias current to said third and fourth Josephson Junctions of about 35% of the critical current of said junctions.

8. A superconductor driver comprising:
a Josephson transmission line, said Josephson transmission line including an input and an output and having a characteristic impedance $Z_0$;
said input for receiving SFQ pulses from an external source;
said output of said Josephson transmission line being adapted for coupling to a resistive load that is at least four times greater than said $Z_0$ to emulate an open-circuit condition to said Josephson transmission line, wherein an SFQ applied to said input propagates along said line and is reflected from said output back toward said input, producing momentarily a flux quantum pulse at said output that is double in size relative to said SFQ pulse;
said Josephson transmission line including a first Josephson loop coupled to said input and defining a transmission path;
a Josephson junction located in series circuit with said transmission path, said Josephson junction being oriented in said series circuit to prevent any SFQ pulse propagating from said output from reaching said input.

9. A superconductor driver for producing double flux quantum pulses at an output for application to a load in response to single flux quantum pulses applied to an input, comprising:
a superconductor one-way buffer connected to said input;
a Josephson transmission line connected between an output of said one-way buffer and said output, said Josephson transmission line having a characteristic impedance much smaller than the characteristic impedance of said load, wherein said transmission line emulates an open-circuit transmission line to produce a double flux quantum pulse at said output and reflect a single flux quantum pulse toward said input; and
said one-way buffer for propagating SFQ pulses received at said input to said Josephson transmission line, whereby said SFQ pulses may propagate through said Josephson transmission line to said output, and for preventing SFQ pulses propagating thereto from said Josephson transmission line from propagating to said input.

10. The superconductor driver as defined in claim 9, wherein said Josephson transmission line possesses a characteristic impedance, and wherein said load possesses a characteristic impedance that is no less than three times as large as said characteristic impedance of said Josephson transmission line.

11. The superconductor driver as defined in claim 10, wherein said characteristic impedance of said load is at least eight times as large as said characteristic impedance of said Josephson transmission line.

12. The superconductor driver as defined in claim 9, wherein said superconductor one-way buffer comprises:
an inductive line connected to said input, and including an output;
first, second and third Josephson Junctions each containing first and second ends;
said first end of said first Josephson Junction coupled to an end of said inductive line;
a second inductive line;
said first end of said second Josephson junction being connected to one end of said second inductive line and said second end connected to said first end of said first Josephson junction; and an opposite end of said second inductive line being connected to said first end of said third Josephson junction.

13. The superconductor driver as defined in claim 12, wherein said Josephson transmission line comprises:
third, fourth and fifth inductive wires;
said third, fourth and fifth inductive wires being connected in series circuit between said output of said one-way buffer and said output;
fourth and fifth Josephson junctions, each including first and second ends;
said first end of said fourth Josephson junction being connected between said third and fourth inductive wires to tap into said series circuit;
said first end of said fifth Josephson junction being connected between said fifth inductive wire and said output;
a source of bias current; said source of bias current having a first polarity end connected between said fourth and fifth inductive wires and a second polarity end connected to said second end of each of said fourth and fifth Josephson Junctions.

14. The superconductor driver as defined in claim 13, wherein said Josephson transmission line possesses a characteristic impedance, and wherein said load possesses a characteristic impedance that is no less than three times as large as said characteristic impedance of said Josephson transmission line.

15. A superconductor driver for producing double flux quantum pulses at an output for application to a load in response to single flux quantum pulses applied to an input as defined in claim 9, wherein said Josephson transmission line further includes a Josephson loop.

* * * * *